(12) United States Patent
Wang et al.

(10) Patent No.: US 7,989,313 B2
(45) Date of Patent: Aug. 2, 2011

(54) METHOD AND APPARATUS FOR CREATING RFID DEVICES

(75) Inventors: Haochuan Wang, South Pasadena, CA (US); Ali Mehrabi, Glendale, CA (US); Kouroche Kian, Altadena, CA (US); Dave N. Edwards, La Canada, CA (US); Akiko Tanabe, Los Angeles, CA (US); Mark Licon, Diamond Bar, CA (US); Jay Akhave, Claremont, CA (US)

(73) Assignee: Avery Dennison Corporation, Pasadena, CA (US)

( * ) Notice: Subject to any disclaimer, the term of this patent is extended or adjusted under 35 U.S.C. 154(b) by 758 days.

(21) Appl. No.: 12/104,156

(22) Filed: Apr. 16, 2008

(65) Prior Publication Data

US 2008/0194059 A1    Aug. 14, 2008

Related U.S. Application Data

(62) Division of application No. 11/122,539, filed on May 4, 2005, now Pat. No. 7,364,983.

(51) Int. Cl.
*H01L 21/46* (2006.01)
*H01L 21/30* (2006.01)
*H01L 21/78* (2006.01)
*H01L 21/82* (2006.01)
*H01L 23/544* (2006.01)
*H01L 21/768* (2006.01)

(52) U.S. Cl. ........ 438/458; 438/460; 438/462; 438/464; 438/128; 257/620; 257/E21.596; 257/E21.599

(58) Field of Classification Search .................. 438/458, 438/460, 462, 464, 128; 257/620, E21.596, 257/E21.599
See application file for complete search history.

(56) References Cited

U.S. PATENT DOCUMENTS

| 3,497,948 A | 3/1970 | Wiesler et al. |
| 3,568,307 A | 3/1971 | Zanger et al. |
| 3,859,723 A | 1/1975 | Hamer et al. |
| 4,346,514 A | 8/1982 | Makizawa et al. |

(Continued)

FOREIGN PATENT DOCUMENTS

EP    0075491    1/1987

(Continued)

OTHER PUBLICATIONS

PCT Written Opinion of the International Searching Authority (PCT Rule 43 bis.1): International Application No. PCT/US06/19642, International Filing Date May 19, 2006, Priority Date May 19, 2005, Applicant Avery Dennison Corp.

(Continued)

*Primary Examiner* — Luan C Thai

(57) ABSTRACT

A process is disclosed for creating semiconductor devices such as RFID assemblies wherein an array of dies mounted to a substrate is spaced apart at a first pitch, and the substrate is removed after the positions of the dies in the array is fixed by a solidifiable substance. The solidifiable substance is then removed without changing the relative positions of the dies in the array. All or a selected portion of the array of dies is then electrically attached to a plurality of straps or interposers arranged in a corresponding array. The spacing, or pitch, between the dies in the die array may be changed before or after the substrate is removed to match the pitch of the straps or interposers in the corresponding array. An RFID device created using the process inventive is also disclosed.

15 Claims, 13 Drawing Sheets

U.S. PATENT DOCUMENTS

| | | | |
|---|---|---|---|
| 4,590,667 | A | 5/1986 | Simon |
| 4,627,151 | A | 12/1986 | Mulholland et al. |
| 4,941,255 | A | 7/1990 | Bull |
| 5,628,855 | A | 5/1997 | Hartmann et al. |
| 6,121,118 | A | 9/2000 | Jin et al. |
| 6,204,079 | B1 * | 3/2001 | Aspar et al. .................. 438/25 |
| 6,204,092 | B1 | 3/2001 | Freund et al. |
| 6,520,244 | B2 * | 2/2003 | Lapeus et al. ................ 164/228 |
| 6,527,964 | B1 | 3/2003 | Smith et al. |
| 6,534,386 | B2 * | 3/2003 | Irie .............................. 438/464 |
| 6,566,744 | B2 | 5/2003 | Gengel |
| 6,573,112 | B2 | 6/2003 | Kono et al. |
| 6,613,610 | B2 | 9/2003 | Iwafuchi et al. |
| 6,846,698 | B2 * | 1/2005 | O'Keefe et al. ............... 438/106 |
| 6,848,162 | B2 | 2/2005 | Arneson et al. |
| 7,023,347 | B2 | 4/2006 | Arneson et al. |
| 7,169,691 | B2 * | 1/2007 | Doan ............................. 438/598 |
| 2001/0018229 | A1 * | 8/2001 | Kato et al. .................... 438/106 |
| 2003/0211652 | A1 | 11/2003 | Summers |
| 2004/0020036 | A1 | 2/2004 | Arneson et al. |
| 2004/0020037 | A1 | 2/2004 | Arneson et al. |
| 2004/0020038 | A1 | 2/2004 | Arneson et al. |
| 2004/0020039 | A1 | 2/2004 | Arneson et al. |
| 2004/0020040 | A1 | 2/2004 | Arneson et al. |
| 2004/0192011 | A1 | 9/2004 | Roesner |
| 2004/0250417 | A1 | 12/2004 | Arneson et al. |
| 2004/0250949 | A1 | 12/2004 | Arneson et al. |
| 2005/0005434 | A1 | 1/2005 | Arneson et al. |
| 2005/0009232 | A1 | 1/2005 | Arneson et al. |
| 2005/0015970 | A1 | 1/2005 | Arneson et al. |
| 2005/0282355 | A1 | 12/2005 | Edwards et al. |
| 2006/0005911 | A1 * | 1/2006 | Kubo et al. ..................... 156/84 |

FOREIGN PATENT DOCUMENTS

| | | |
|---|---|---|
| EP | 0949662 | 10/1999 |
| EP | 0982762 | 4/2005 |
| JP | 3-30442 | 2/1991 |

OTHER PUBLICATIONS

Amendment and Response to Restriction Requirement as filed on Sep. 28, 2007 in Prior U.S. Appl. No. 11/122,539.

Restriction Requirement dated Aug. 31, 2007 from Prior U.S. Appl. No. 11/122,539.

Notice of Allowance dated Dec. 14, 2007 from Prior U.S. Appl. No. 11/122,539.

* cited by examiner

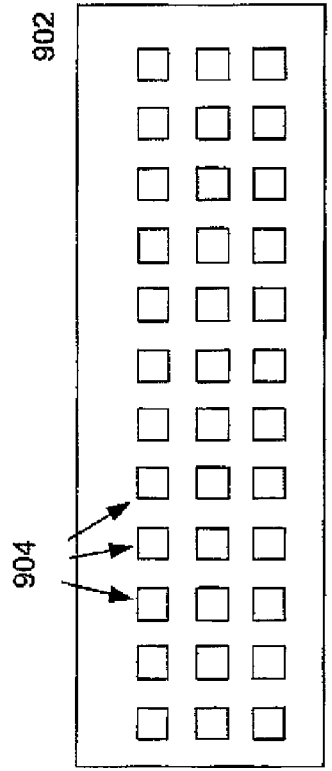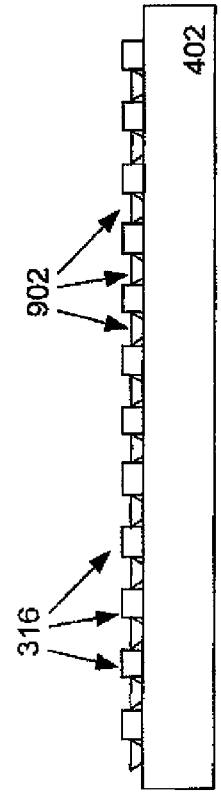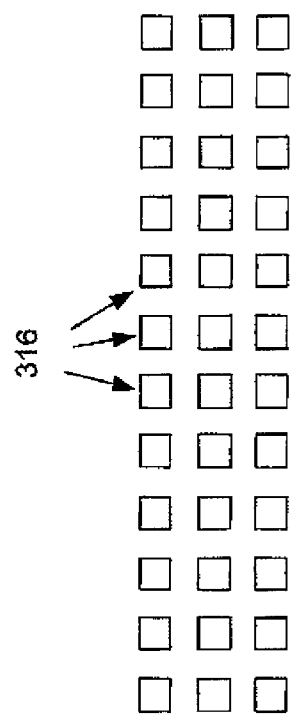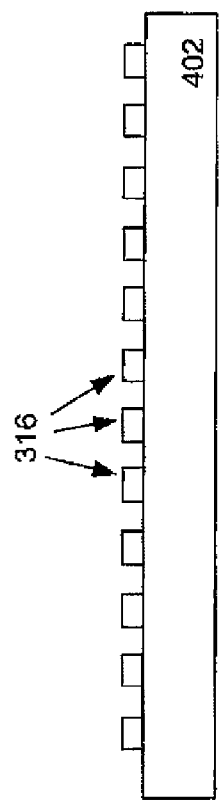
FIG. 9

METHOD AND APPARATUS FOR CREATING RFID DEVICES

CROSS-REFERENCE TO RELATED APPLICATION

This application is a Divisional of U.S. patent application Ser. No. 11/122,539, filed on May 4, 2005 now U.S. Pat. No. 7,364,983, entitled "Method And Apparatus For Creating RFID Devices" by Haochuan Wang et al., which is incorporated by reference herein.

FIELD OF THE INVENTION

The present invention relates generally to manufacturing of semiconductor devices, and more particularly, to a method and apparatus for creating RFID devices.

BACKGROUND OF THE INVENTION

Automatic identification of products has become commonplace. For example, the ubiquitous barcode label, placed on food, clothing, and other objects, is currently the most widespread automatic identification technology that is used to provide merchants, retailers and shippers with information associated with each object or item of merchandise.

Another technology used for automatic identification products is Radio Frequency Identification (RFID). RFID uses labels or "tags" that include electronic components that respond to radio frequency commands and signals to provide identification of each tag wirelessly. Generally, RFID tags and labels comprise an integrated circuit (IC, or chip) attached to an antenna that responds to a reader using radio waves to store and access the ID information in the chip. Specifically, RFID tags and labels have a combination of antennas and analog and/or digital electronics, which often includes communications electronics, data memory, and control logic.

One of the obstacles to more widespread adoption of RFID technology is that the cost of RFID tags are still relatively high as lower cost manufacturing of RFID tags has not been achievable using current production methods. Additionally, as the demand for RFID tags has increased, the pressure has increased for manufacturers to reduce the cost of the tags, as well as to reduce the size of the electronics as much as possible so as to: (1) increase the yield of the number of chips (dies) that may be produced from a semiconductor wafer, (2) reduce the potential for damage, as the final device size is smaller, and (3) increase the amount of flexibility in deployment, as the reduced amount of space needed to provide the same functionality may be used to provide more capability.

However, as the chips become smaller, their interconnection with other device components, e.g., antennas, becomes more difficult. Thus, to interconnect the relatively small contact pads on the chips to the antennas in RFID inlets, intermediate structures variously referred to as "straps," "interposers," and "carriers" are sometimes used to facilitate inlay manufacture. Interposers include conductive leads or pads that are electrically coupled to the contact pads of the chips for coupling to the antennas. These leads provide a larger effective electrical contact area between the chips and the antenna than do the contact pads of the chip alone. Otherwise, an antenna and a chip would have to be more precisely aligned with each other for direct placement of the chip on the antenna without the use of such strap. The larger contact area provided by the strap reduces the accuracy required for placement of the chips during manufacture while still providing effective electrical connection between the chip and the antenna. However, the accurate placement and mounting of the dies on straps and interposers still provide serious obstacles for high-speed manufacturing of RFID tags and labels. Two challenging areas currently facing manufacturers include:

1) Die Attachment: Accurately positioning dies (i.e., chips) for attachment to strap leads is difficult to achieve at the speeds needed to achieve high volume manufacturing.

2) Bonding: It is difficult to accurately bond, cure, and electrically connect the chips to strap leads at rates necessary to achieve high volume manufacturing.

Several possible high-speed strap assembly strategies have been proposed. The first approach, which uses "pick-and-place" machines typically used in the manufacturing of circuit boards for picking up electronic components and placing them on circuit boards, is accurate, but requires expensive machines that ultimately do not deliver a sufficient throughput to justify the increased cost. Another approach, referred to as a "self-assembly process," is a method in which multiple chips are first dispersed in a liquid slurry, shaken and assembled into a substrate containing chip receiving recesses. Some current processes are described in U.S. Pat. No. 6,848,162, entitled "Method and Apparatus for High Volume Assembly of Radio Frequency Identification Tags," issued to Arneson, et al. on Feb. 1, 2005; U.S. Pat. No. 6,566,744, entitled "Integrated Circuit Packages Assembled Utilizing Fluidic Self-Assembly," issued to Gengel on May 20, 2003; and, U.S. Pat. No. 6,527,964, entitled "Methods and Apparatuses for Improved Flow in Performing Fluidic Self Assembly," issued to Smith et al. on Mar. 4, 2003.

Accordingly, there is a long-felt, but as yet unsatisfied need in the RFID device manufacturing field to be able to produce RFID devices in high volume, and to assemble them at much higher speed per unit cost than is possible using current manufacturing processes.

SUMMARY OF THE PREFERRED EMBODIMENTS

In accordance with the various exemplary embodiments thereof described herein, the present invention provides a process for creating semiconductor devices, such as RFID assemblies, which begins with the provision of an array of semiconductor dies mounted to a substrate and spaced apart at a first pitch, for example, as may be found in a singulated semiconductor wafer attached to a wafer sawing, or "blue" tape. The relative positions of the dies is first fixed by a solidifiable material, and the substrate and the solidifiable material are then removed from the dies without changing their relative positions in the array. The array of dies, or selectable subsets thereof, are then electrically coupled to respective ones of a plurality of straps, interposers, or antennas disposed in corresponding arrays. Advantageously, the spacing, or pitch, between the dies in the array may be increased before or after the substrate is removed to match the pitch of the plurality of straps or antennas in the corresponding array.

In one exemplary embodiment of the present invention, the process includes a method for transferring a plurality of semiconductor dies from a first substrate, wherein the dies are arranged on the first substrate in a two-dimensional array having a first dimension. The method includes filling an interstitial space between the plurality of dies in the array with a solidifiable substance. The substance is then solidified such that the respective positions of each of the dies in the array is fixed. The first substrate is then removed from the plurality of dies before the solidifiable substance is removed from between the dies such that the plurality of dies remain arrayed at the first dimension.

In another preferred embodiment of the present invention, the process includes a method for creating an arrangement of integrated circuits. The method includes providing a wafer with an array of dies disposed on a substrate, the array having a first dimensional size. The substrate is then stretched so that the array of dies reaches a second dimensional size. The size of the array is then fixed at the second dimensional size with a solid material, and the substrate is removed from the array. The solid material is then removed from the array, e.g., by a gasification process, such that the array of dies remains at the second dimensional size after the removal of the solid material.

In another exemplary embodiment of the present invention, a process for making an RFID assembly includes providing a wafer comprising an array of dies, the array of dies having a first dimensional size. A substrate is attached to the array of dies and the substrate is stretched such that the array of dies is increased from the first dimensional size to a second dimensional size in which the dies are spaced apart by a selected distance or pitch. The array of dies is then fixed at the second dimensional size by introducing a liquid into the spaces between the dies and solidifying the liquid, e.g., by freezing it. The substrate is removed from the dies before converting the solid into a gas.

In a fourth preferred embodiment of the present invention, an RFID device is made by the process of providing a plurality of dies arranged in an array having a first dimension. Each die in the array includes at least one contact and is set off from the adjacent dies by a first pitch as measured between the respective contacts of the die. An interstitial space between the dies is then filled with a solidifiable substance and the substance solidified such that the respective position of each of the dies in the array is fixed. The first substrate and the solidified substance are then removed from the plurality of dies such that the plurality of dies remain arrayed at the first dimension.

A plurality of electrical components is also provided. The electrical components are arranged in an array on a second substrate and have attachment locations disposed at the first pitch. The second substrate is registered with the array of dies such that respective attachment locations of the plurality of electrical components are matched with the respective at least one contact of the dies, and, respective ones of the plurality of electrical components are then electrically coupled to corresponding ones of the dies in the array of dies.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which:

FIG. 9 is a diagram illustrating the displacement of the aligned plurality of dies of FIG. 8 and the fixation of the chip locations through the use of a fixation grid;

Like numerals refer to like parts throughout the several views of the drawings.

DETAILED DESCRIPTION OF THE PREFERRED EMBODIMENTS

The present invention provides a process that completely removes the dies or other devices from a diced wafer mounted on a wafer carrier with virtually no residue of any adhesives used to attach the wafer to the carrier. In addition, the present invention can change the spacing between the dies from an initial pitch, such as a spacing of the dies as initially presented on the wafer, to a new pitch that supports direct attachment of the dies to straps via a high-speed production process such as those using printing presses. The combination of the provision of unattached dies and the accurate alignment thereof at a desired spacing enables manufacturers to produce RFID devices at a substantially higher rate than what is currently achieved, and may enable them to reach or exceed rates of one hundred thousand units per hour. This is a level of magnitude higher than the volume achievable by current manufacturing methods using pick and place machines, viz., about ten thousand units per hour.

Figure 1:
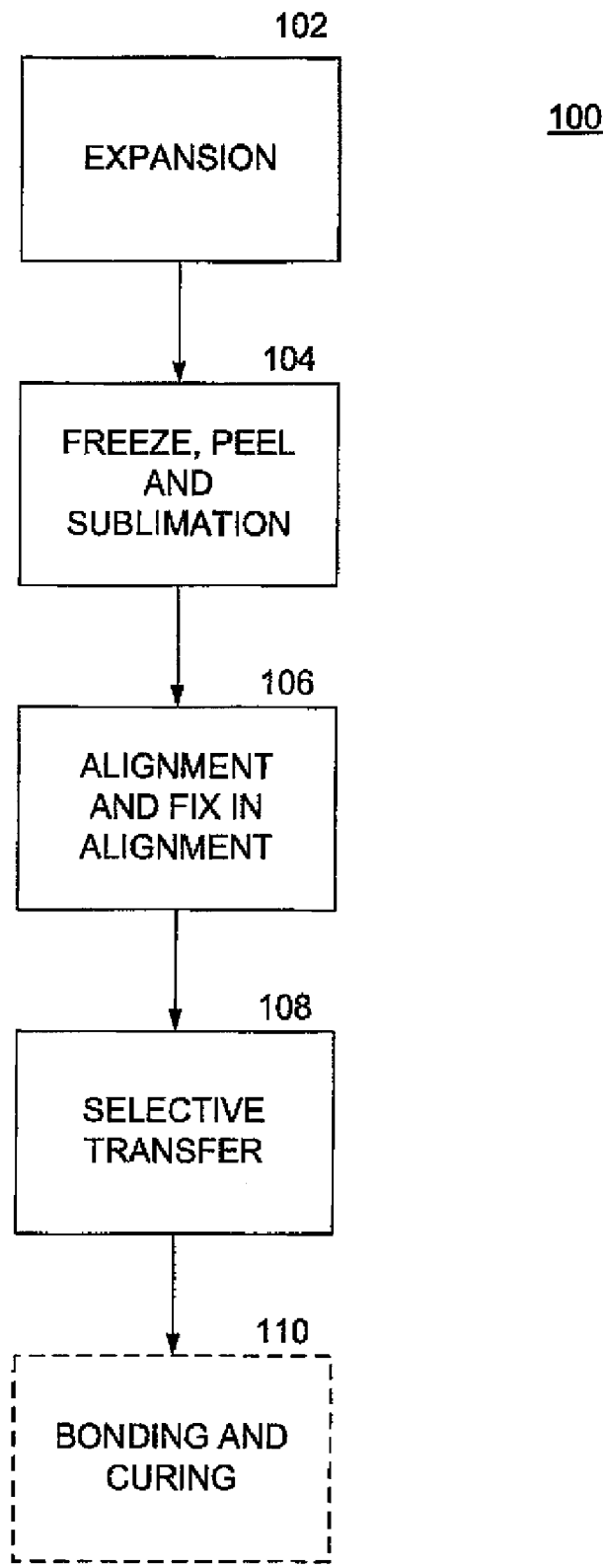
FIG. 1 is a high-level flow diagram of a method for manufacturing a semiconductor device in accordance to a preferred embodiment of the present invention.

FIG. 1 is a high-level overview of one preferred embodiment of a process 100 for the creation of a chip assembly of the present invention adapted for the manufacturing of RFID devices. In general, the process as illustrated involves four different stages, including an expansion stage 102, during which the spacing and pitch between each die in an arrangement of dies on a stretchable substrate may be increased to match a predetermined pitch for a web of straps; a freeze/ peel/sublimation stage 104, during which the stretchable substrate may be removed from the arrangement of dies without leaving residual adhesive compounds; an alignment stage 106, during which the arrangement of dies are further aligned; and a selective transfer stage 108, in which the array of dies or a subset thereof, respectively positioned in locations that match the pitch of a set of straps on a web, are transferred from the arrangement of dies. Finally, once the subset of dies are attached to the set of straps, one possible method for simultaneously bonding the dies to the straps and for curing the adhesive used during that processes is discussed. As is further detailed below, other portions of the die separation and strap attachment process may be optional and the process described herein may include portions that are not needed for a particular application. Therefore, the following description should be read as illustrating exemplary embodiments of a novel die separation and strap attachment process as practiced in one preferred embodiment of the present invention and should not be taken in a limiting sense.

Figure 2:
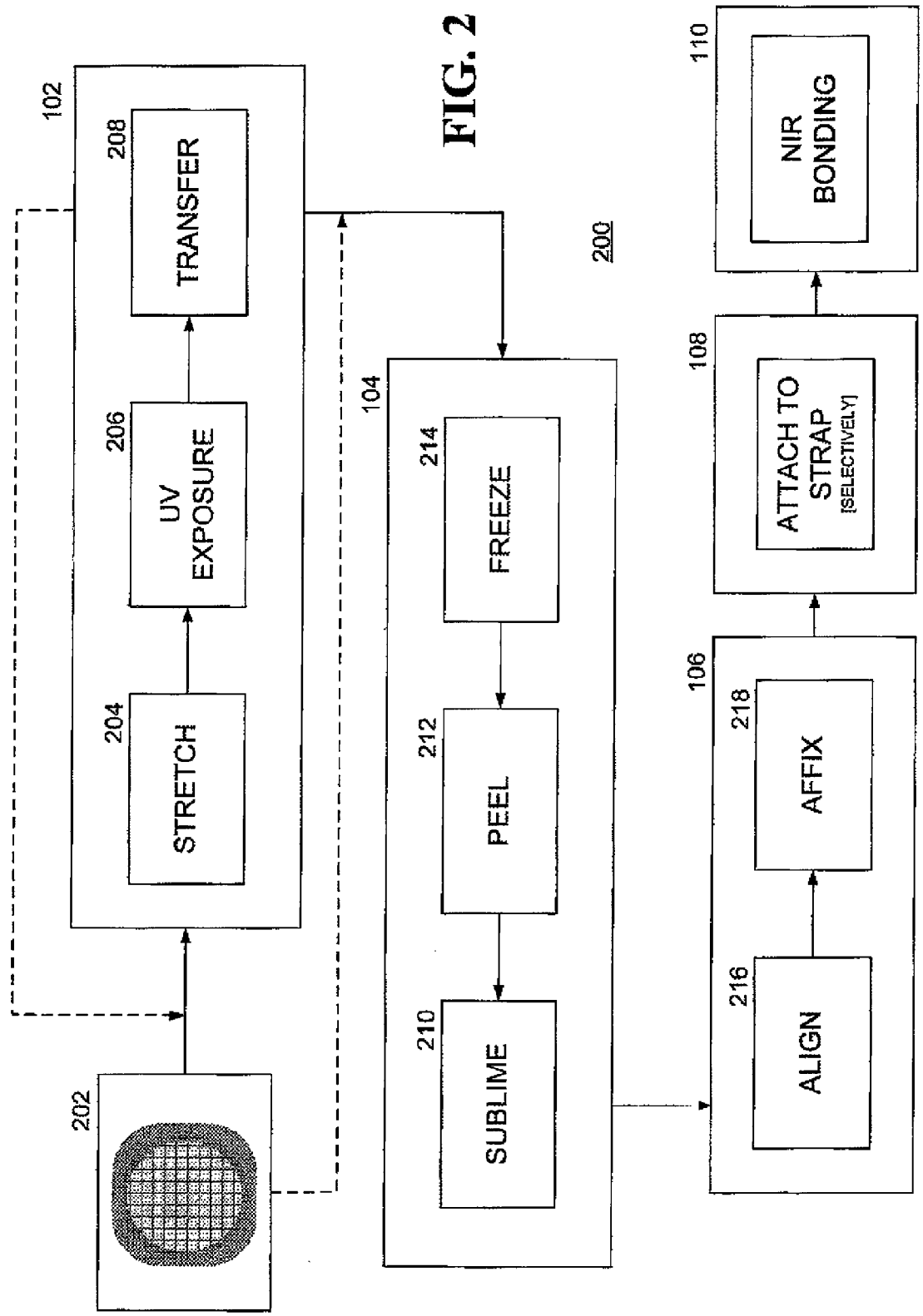
FIG. 2 is a detailed flow diagram of the method for manufacturing the semiconductor device of FIG. 1 in accordance to a preferred embodiment of the present invention.

FIG. 2 illustrates, in greater detail, specific steps in the method for packaging a semiconductor device (such as an RFID device) as shown in FIG. 1, in accordance with one exemplary embodiment of the present invention. The description of the specific steps in FIG. 2 will refer to other figures as appropriate. As described above, the process for creating RFID chip assemblies overcomes two major challenges—whether the process involves the assembly of a chip directly onto an antenna or, alternatively, the assembly of a chip onto a strap before the strap is attached to an antenna. The first hurdle is to attach the chip accurately to specific locations on a structure such as a strap or an antenna. Secondly, the chip has to be bonded both mechanically and electrically with the structure.

The present invention provides an efficient solution to the first problem, viz., how to attach chips accurately to a target location. Specifically, in the present invention, the chip attach solution provides a parallel processing approach in which a plurality of chips are each attached to a corresponding structure simultaneously. However, an issue that arises in the implementation of the above solution is how the dies, which typically are delivered in the form of a diced wafer, will be separated and placed at the appropriate locations. Specifically, after a wafer is fabricated (i.e., after the desired circuitry has been formed on the wafer), it is "diced," i.e., cut into small rectangular pieces with each piece (i.e., a die or chip) having the complete set of circuitry needed to provide the functions for which it was designed. Typically, the wafer is held on a carrier such as an adhesive tape, and the wafer, now composed of the cut-up, or "singulated" dies, remain on the carrier after the dicing. The dies are arranged very close to each other on the adhesive tape, forming a dense array, or matrix, with very a small distance, or pitch, between them. However, the distance (pitch) between adjacent antennas (or adjacent straps on the strap web) is typically much larger, usually by an order of magnitude, than the pitch between the dies. Thus, one problem that needs to be solved for the above-described die attach process is the provision of a method to match the pitch of the dies to the pitch of the straps (or antennas).

Figure 3:
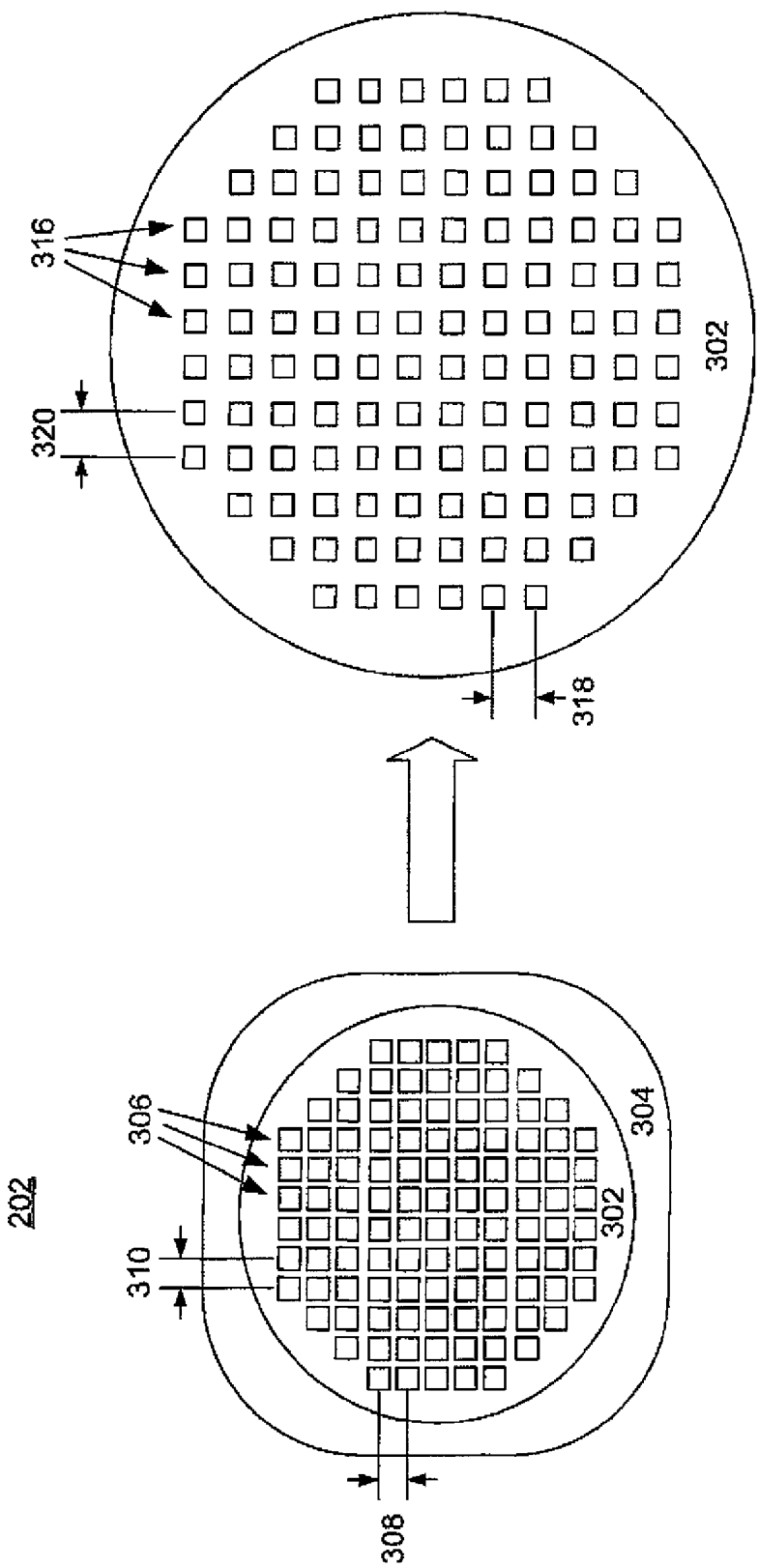
FIG. 3 is a diagram illustrating an expansion of a wafer having a plurality of dies mounted on a substrate pursuant to one preferred embodiment of the present invention.

Referring to FIGS. 2 and 3, a wafer assembly 202 includes a plurality of dies 306 arranged in a rectangular array and located on a substrate 302, such as a wafer tape, which is mounted on a "banjo," or support frame 304. The plurality of dies 306 are initially spaced apart at relatively small orthogonal (i.e., "X" and "Y") pitches 308, 310, which are not large enough to allow processing of a single chip without disturbing the adjacent chips. Although conventional IC processing methods include stretching the wafer tape a small amount (viz., on the order of 10%) to allow the removal of individual chips without affecting others, these traditional solutions do not contemplate the stretching of the substrate 302 to increase the pitch between the plurality of dies 306 by many orders of magnitude so that the pitch of the dies will match the pitch of the structures to which they will ultimately be attached.

In one preferred embodiment of the present invention, the substrate 302 is stretched one or more times so that the pitches 308, 310 are increased to larger pitches 318, 320, and to arrive at a larger-sized second array of dies 316. As noted in the series of steps shown in FIG. 2, the process comprises a stretching or expansion step 204; a UV exposure step 206 that exposes and thereby de-tacks the adhesive used on the substrate 302 to adhere to the dies to it; and a transfer step 208 in which the plurality of dies 306 is transferred from the first substrate 302 of FIG. 2 to another substrate.

In one preferred embodiment, the material used for the substrate 302 is linearly and uniformly stretchable in two orthogonal axes. For example, a polymer substrate film with adhesive bonding may be used. The film is attached to the back of the wafer (i.e., the side of the wafer opposite the "active" side of the wafer that typically includes the contact pads of the dies). During the transfer, the stretched substrate, such as substrate 302, may be scored or cut to enable the second substrate to be more easily stretched. The process of stretching, de-tacking and transferring may be continued indefinitely until a desired pitch (or orthogonal pitches) between the dies is (are) reached. In another preferred embodiment, the stretching does not have to be uniform and may be of a greater magnitude in one axis than another. For example, as described further below, straps are typically elongated structures that are more closely spaced in one direction so that it may be unnecessary to stretch one of the orthogonal pitches of the plurality of dies 306 as much as the other so as to match the particular two-dimensional pitch of the straps.

Figure 4:
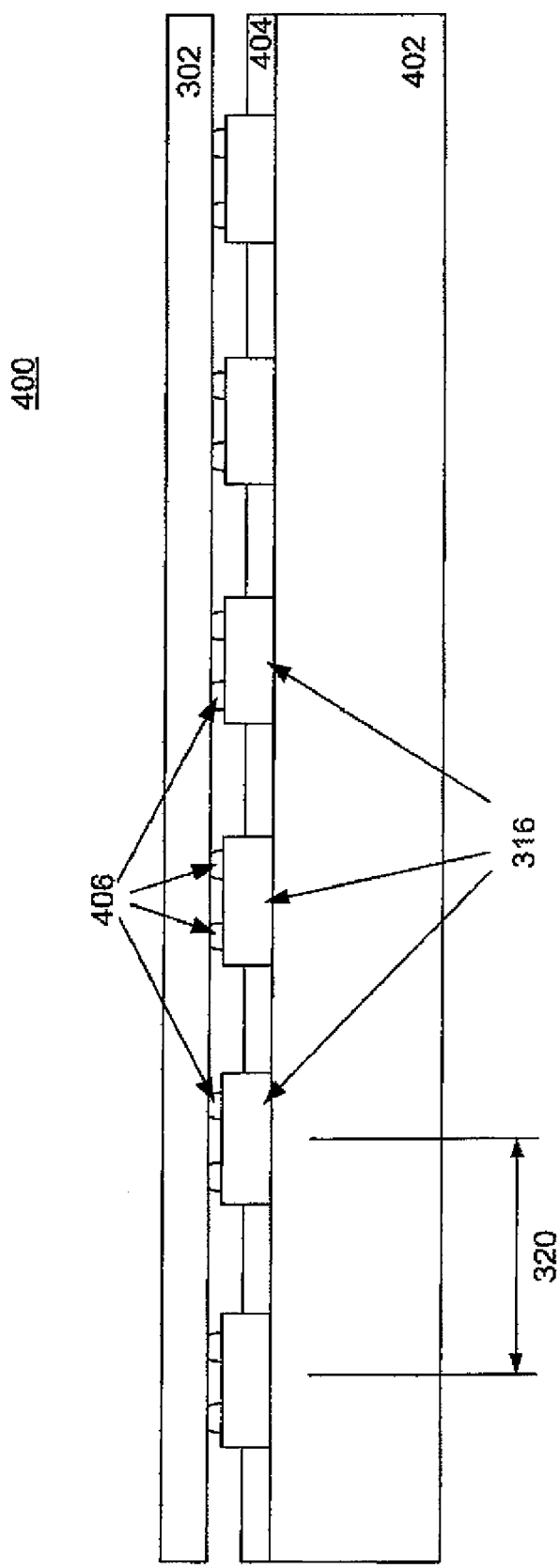
FIG. 4 is a side view of the plurality of dies of FIG. 3 as displaced on a support platform and fixed in position by being frozen in a layer of ice after the expansion process.
Figure 5:
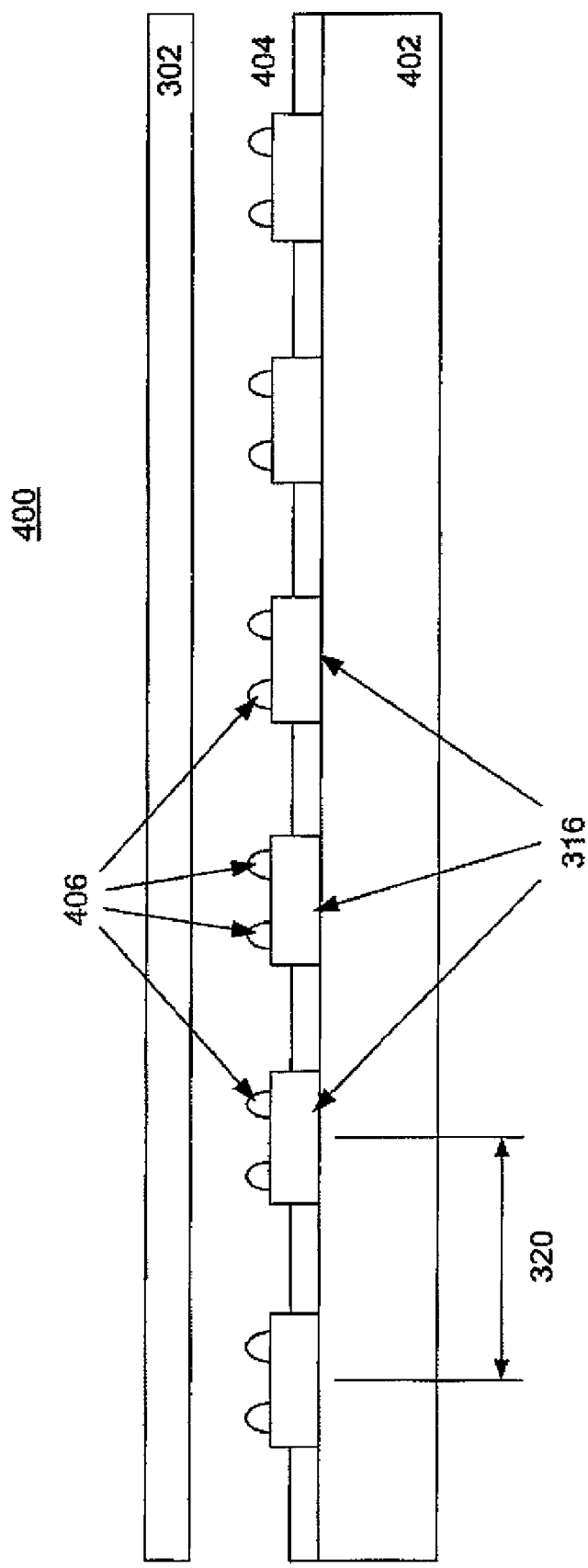
FIG. 5 is a side view of the plurality of dies of FIG. 4 wherein the substrate is being removed in accordance with one preferred embodiments of the present invention.

After the plurality of dies 306 has been stretched to arrive at the larger-sized second array of dies 316, the next step is the freeze/peel/sublimation series of steps as represented by block 104 of FIG. 2. In one preferred embodiment of the present invention, as illustrated by FIG. 4, in order to fix the orthogonal pitches 318, 320 of the dies and to enable the relatively "clean" removal of an adhesive tape such as the substrate 302 from the dies of the array of dies 316, the substrate 302, with the array of dies thereon, is placed against a plate 402 (with the dies sandwiched in between), and a solidifiable substance 404, such as de-ionized, distilled water is introduced in the interstitial spaces 320 between the dies 316 of the array. The temperature of the solidifiable substance 404 is then lowered to be below its freezing point such that it is changed in state to form a solid block, and such that it holds the array of dies 316 at the desired pitches 318 and 320. Then, in step 212, the substrate 302 is peeled away from the array of dies 316 to expose a plurality of contacts 406, with the array of dies 316 still being held by the solidified substance 404, as shown in FIG. 5.

In one preferred embodiment of the present invention, once the substrate 302 is removed, the solidifiable substance 404 may be removed so as to leave the dies 316 arranged on the plate 402 in their original dimensional array. In another preferred embodiment of the present invention, the solidifiable substance may first be used as a "carrier" to move the dies from support 402 as the array of dies 316 may be more easily transported in this arrangement to another location for further processing. For example, the array of dies 316 may be moved from support 402 to a tray (not shown) that will hold several such arrays of dies. Optionally, additional amounts of solidifiable substance 404 may then be introduced to join the multiple arrays of dies together. In this manner, the multiple arrays of dies can be assembled to form even larger arrays of dies.

Figure 6:
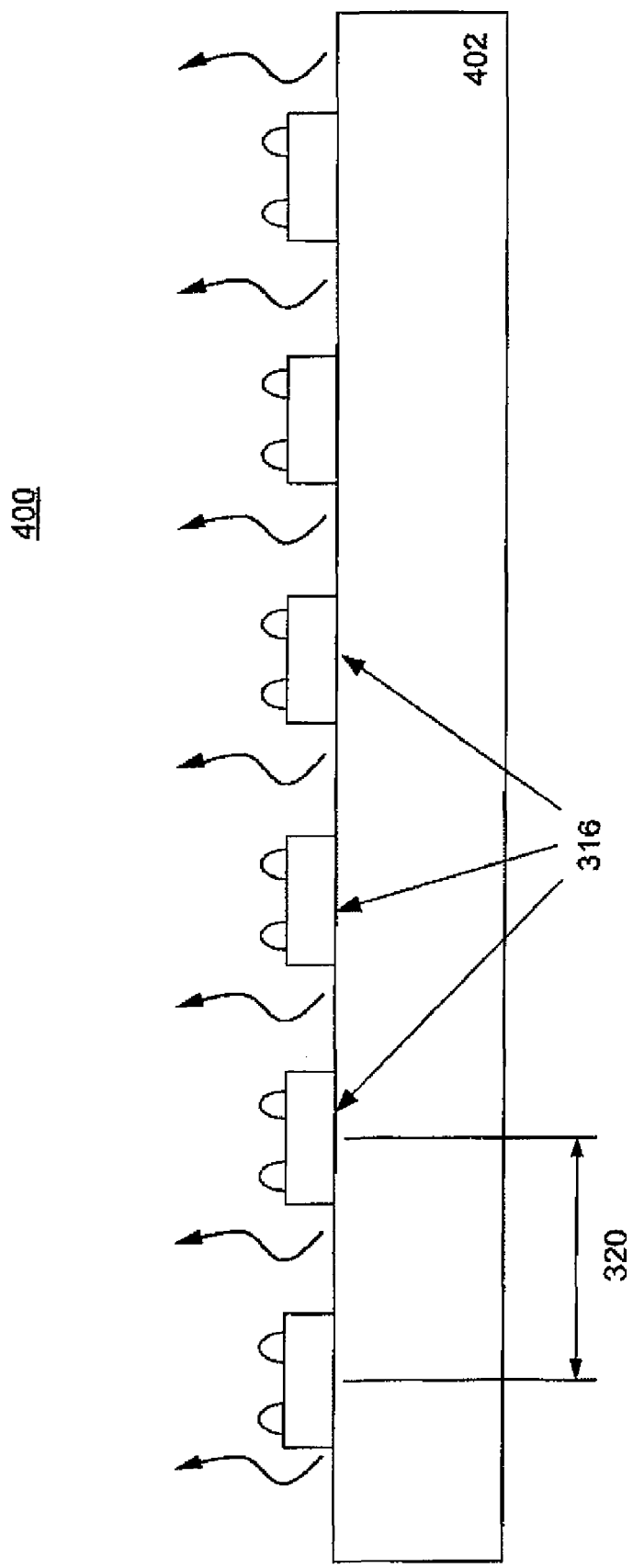
FIG. 6 is a side view of the plurality of dies of FIG. 4 wherein the ice that secured the plurality of dies in FIG. 4 and FIG. 5 has been removed by sublimation.
Figure 7:
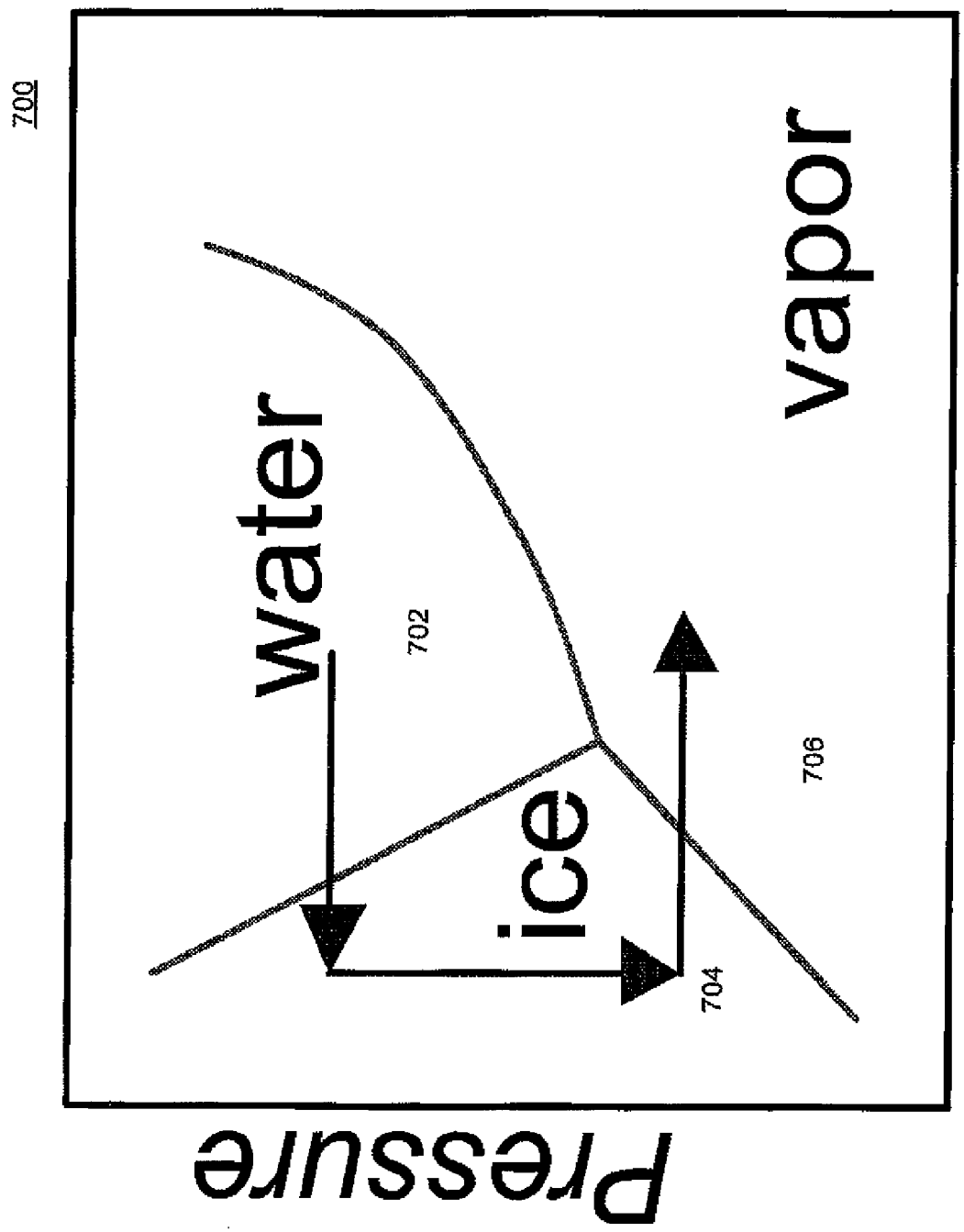
FIG. 7 is a phase diagram illustrating the state diagram for water.

In one preferred embodiment of the present invention, the solidifiable substance 404 is removed without affecting the orientation of the array of dies 316 by sublimating the solidifiable substance 404, as shown in FIG. 6. The change in state in a case in which water is used as the solidifiable substance 404 is shown in FIG. 7, which is a phase diagram illustrating the general principle of sublimation as used herein. The solidifiable substance 404 may be changed directly from a liquid state 702 to a solid state 704, and finally to a gaseous state 706 by altering the temperature and/or pressure of the environment in which support surface 402 is located.

It should be noted that, in some cases, it might not be necessary to keep the original position and pattern/orientation of the dies. Thus, in another preferred embodiment of the present invention, in which the solidifiable substance 404 is a liquid like water, the solidified substance, viz., ice, can simply be thawed and the array of dies 316 be allowed to dry under appropriate ambient conditions. Again, if the position and pattern of the dies 316 of the array need to be maintained, the frozen liquid can be sublimated directly into vapor, so that the dies do not float, or otherwise move on the support surface 402 as the solidified substance is removed. In one preferred embodiment of the present invention, the sublimation is achieved by known freeze-drying techniques, or by blowing mild, warm dry air onto the frozen surface. In another preferred embodiment, to keep the original position and orientation of the dies in the array of dies 316, a porous or liquid absorbing surface may be used for the support 402. In this embodiment, there is no need to wait for the sublimation process to complete, as the solidifiable substance 404, as it turns into its liquid state, will drain into the porous or liquid absorbing surface without floating or moving the dies in the array of dies 316. Further, a vacuum can also be applied on the porous surface to accelerate the removal of liquid.

Although the process described above is described as using a liquid for the solidifiable substance 404, other materials may be used to allow alternative dissipation methods. In other words, there are other approaches that may be used to remove the solidifiable substance 404 from the die matrix. For example, in one preferred embodiment of the present invention, where organic materials and polymers are used as the solidifiable substance 404, a plasma ashing process may be used to remove the organic materials and polymers from the matrix without disturbing the original positions of the dies. In plasma ashing, a monatomic (oxygen or fluorine) reactive specie is generated using a plasma source. The reactive specie combines with the polymer to form a gaseous product that may then removed with a vacuum pump.

In another preferred embodiment of the present invention, reactive ion etching (sometimes referred to as reactive sputter etching), which is a process that consists of bombarding the material to be etched with highly energetic chemically reactive ions, is used to remove solidifiable substance 404. Such bombardment with energetic ions dislodges atoms from the solidifiable substance 404, i.e., the material to be removed, without adversely affecting the adjacent dies 316, in effect, achieving removal by sputtering of the solidifiable substance 404. Preferably, in addition to sputter-removal, the bombarding ions used in reactive ion etching are chosen so that they will chemically react with the material being bombarded to produce highly volatile reaction byproducts that can simply be pumped out of the system. Gases such as tetrafluoromethane (CF4) or sulfur hexafluoride (SF6) are two exemplary gases that may be used in the reactive ion etching process without affecting the dies.

In yet another preferred embodiment of the present invention, the solidifiable substance 404 can be removed by a dissolution process, in which the solidifiable substance 404 used is a dissipative material. For example, certain polymers can be dissolved in specific solvents. Similarly, chemical etching, in which acid or base etching liquids are used to remove materials, can also used to remove the solidifiable substance 404.

As those of skill in the art will appreciate, the present invention provides for the separation of dies from adhesive tape with minimal damage during the adhesive tape removal and separation process, and also enables the dies 316 of to be freed of the adhesive tape relatively cleanly. In addition, the position and pattern of orientation of the devices, as disposed on the original tape or another tape if the array has been stretched or transferred multiple times, is preserved. Further, the removal of the substrate from the array of the dies 316 and their re-positioning within the array is effected with no damage to the dies themselves.

Figure 8:
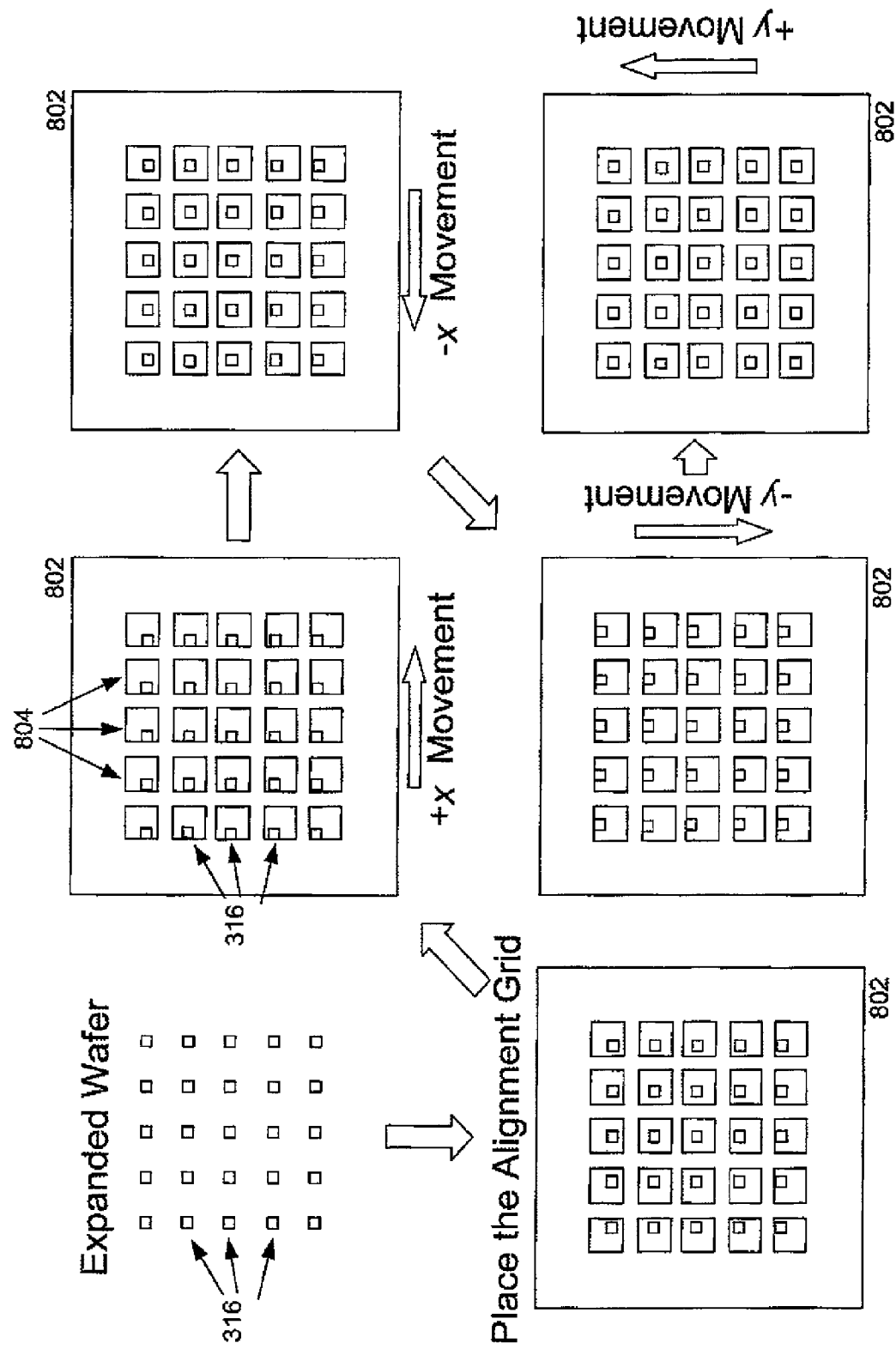
FIG. 8 is a diagram illustrating the alignment of the plurality of dies using a alignment grid configured in accordance with one preferred embodiment of the present invention.

Although the tape removal process as described above is not intended to affect the position of the dies in the array of dies 316, the alignment of the dies after step 210 may still not be as accurate as desired. In step 216 of FIG. 2, and referring to FIG. 8, the use of a precision die alignment grid 802 to further align the array of dies 316 on the support surface 402 is illustrated. In one preferred embodiment of the present invention, the alignment grid 802 is moved in a first direction parallel to the support surface 402, then in a second direction opposite to the first direction. Then, the alignment grid 802 is moved in a third direction that is orthogonal to the first and second directions, and finally the alignment grid 802 moved in a fourth direction opposite to the third direction. Once the dies in the array of dies 316 have been align as desired, it may be desirable to fix their position in the new alignment arrangement, as noted in step 218 of FIG. 2.

Referring to FIG. 9, a fixation grid 902 may be used to fix the position and orientation of the dies in the array of dies 316. As seen in the figure, the fixation grid 902 includes a plurality of apertures 904. In one preferred embodiment of the present invention, each of the apertures 904 includes an opening on one side of the fixation grid 902 that is slightly larger than the size of a respective die 316 in the array, and an opening on the opposite side of the grid that is substantially the same size as a respective die of the array. Thus, the side of fixation grid 902 with the larger openings for the plurality of apertures 904 is placed over the array of dies 316, the grid is moved downward toward and into contact with the support surface 402, and the tapered interior sidewalls of the fixation grid 902 apertures 904 urge the dies 316 of the array into a more precise alignment that corresponds to the precision of the apertures in the grid. In another preferred embodiment of the present invention, the openings on one side of the plurality of apertures 904 may be smaller than the size of the dies in the array of dies 316 to hold the dies in position against support 404 so that they may be transported for further processing.

The alignment grid 902 can be fabricated of, e.g., semiconductor materials, e.g., silicon, using well-known micromachining techniques, in a manner similar to those described in, e.g., U.S. Pat. No. 6,573,112 to Kono et al.

Figure 10:
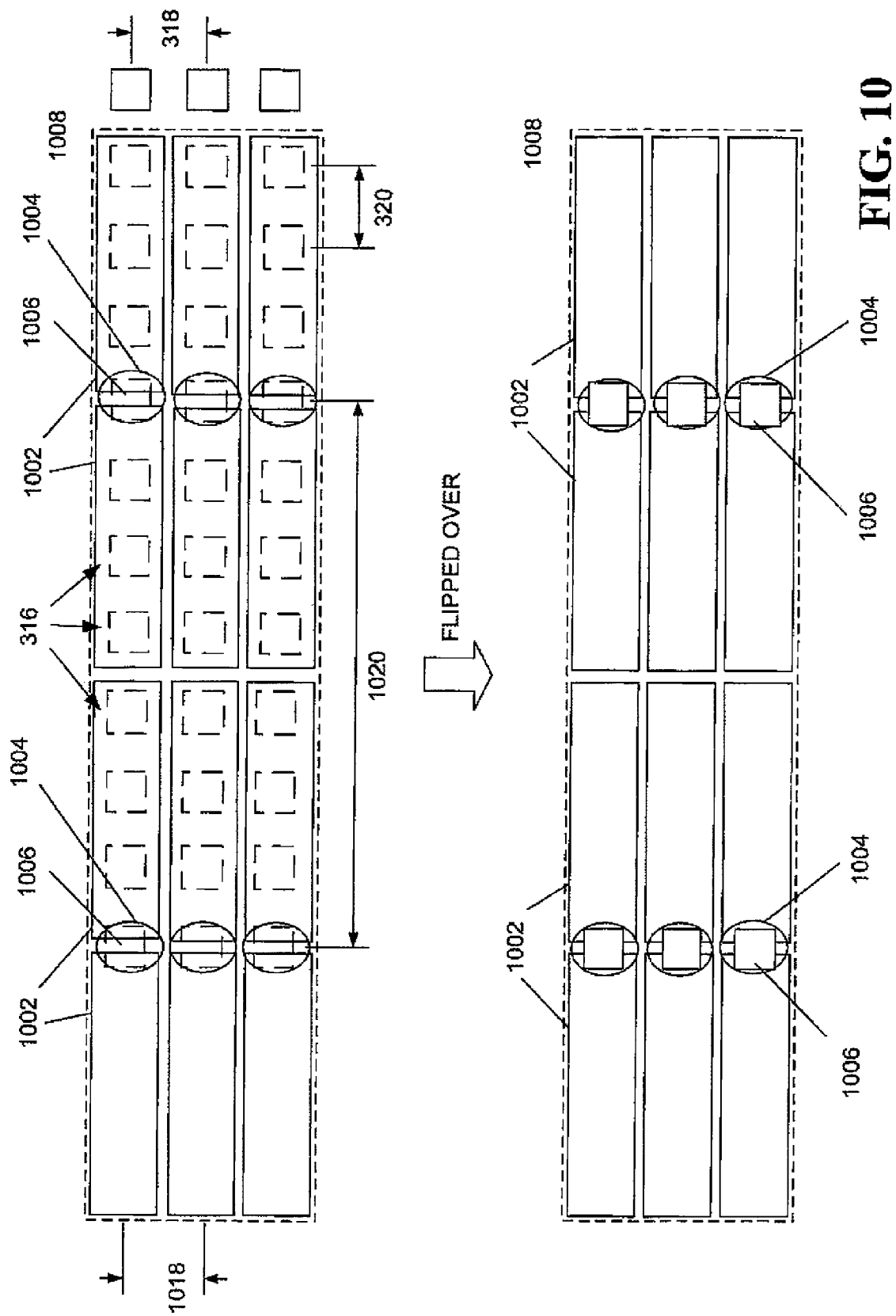
FIG. 10 is a plan view illustrating a selective transfer of a subset of the plurality of dies onto a corresponding set of straps in accordance to one preferred embodiment of the present invention.
Figure 11:
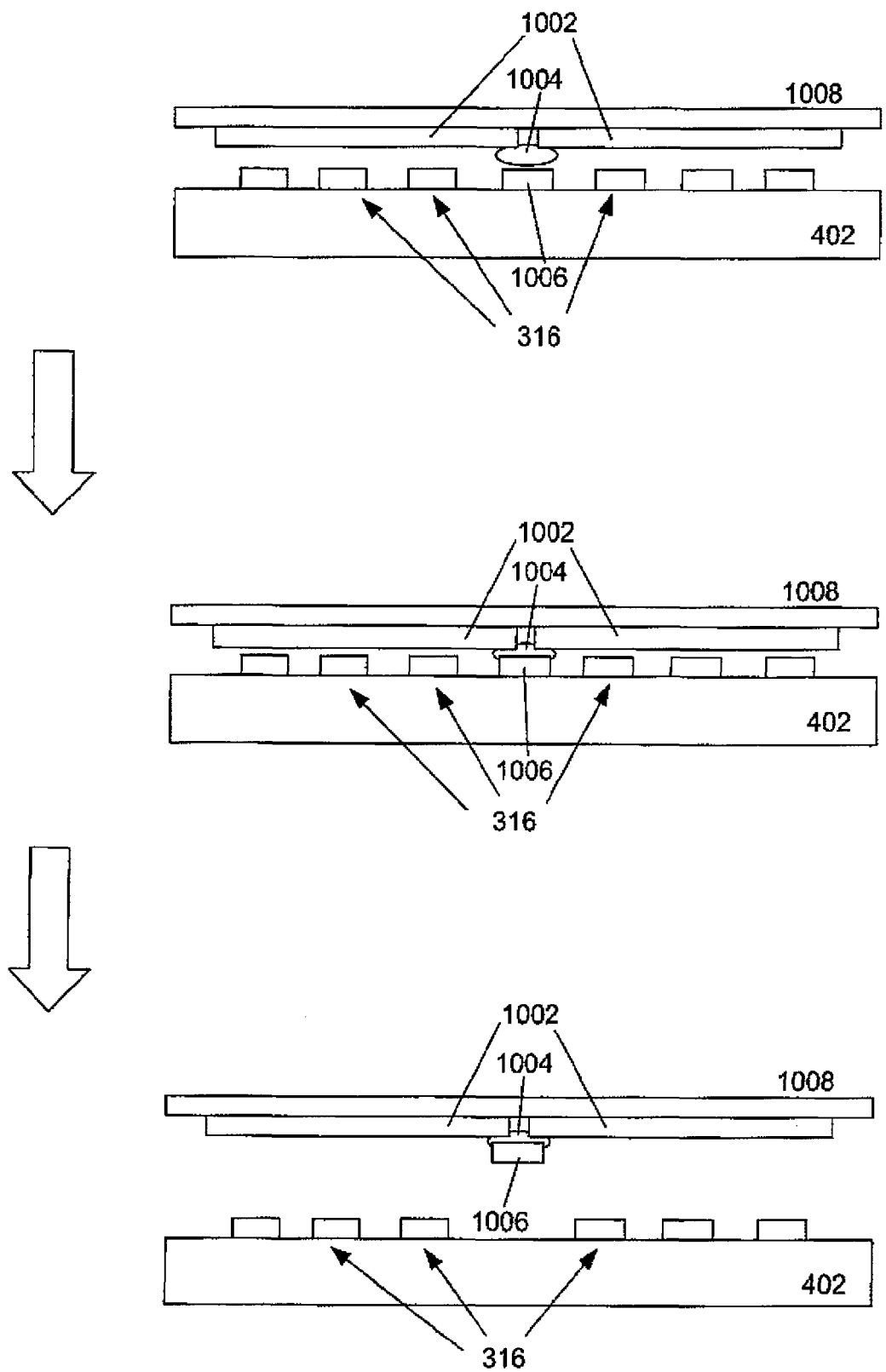
FIG. 11 is a side view illustrating the selective transfer of FIG. 10.

FIGS. 10 and 11 illustrate a process for selectively attaching a plurality of straps 1002 mounted on a strap support substrate, or web 1008, to a subset of dies 1006 in the array of dies 316 by overlaying the straps 1002 on the dies. The dies are attached to a respective pair of straps with an adhesive 1004. In one preferred embodiment of the present invention, the adhesive 1004 is a In one preferred embodiment of the present invention, adhesive 1004 is an anisotropic conductive adhesive (z-conductive adhesive). As shown in the top portion of FIG. 10, the strap support structure 1008 is illustrated with a dotted outline to represent that it is only a portion of a support structure that may contain more straps that are not shown. In one preferred embodiment of the present invention, the size of the orthogonal pitches 318, 320 between the dies in the array of dies 316 are matched to respective corresponding orthogonal pitches 1018, 1020 of the plurality of straps 1002 in such a way that the size of the pitches 1018, 1020 between the plurality of straps 1002 is a multiple of at least one of the pitches 318, 320 of the dies 316 of the array. Thus, as illustrated in FIG. 10, the substrate on which the array of dies 316 is placed is stretched such that the final pitch 320 between the dies matches the pitch 1020 of the straps, or, if it is impractical to stretch the substrate to reach a pitch that is equal to the pitch 1020 of the straps, then to an integer multiple thereof. In FIG. 10 and FIG. 11, it is assumed that the pitch 318 between the dies has been made equal to the spacing of the pitch 1018 between the straps. Thus, in one preferred embodiment of the present invention, the size of the pitch 318 is equal to the pitch 320, and in another preferred embodiment, may be an integer multiple thereof.

Figure 12:
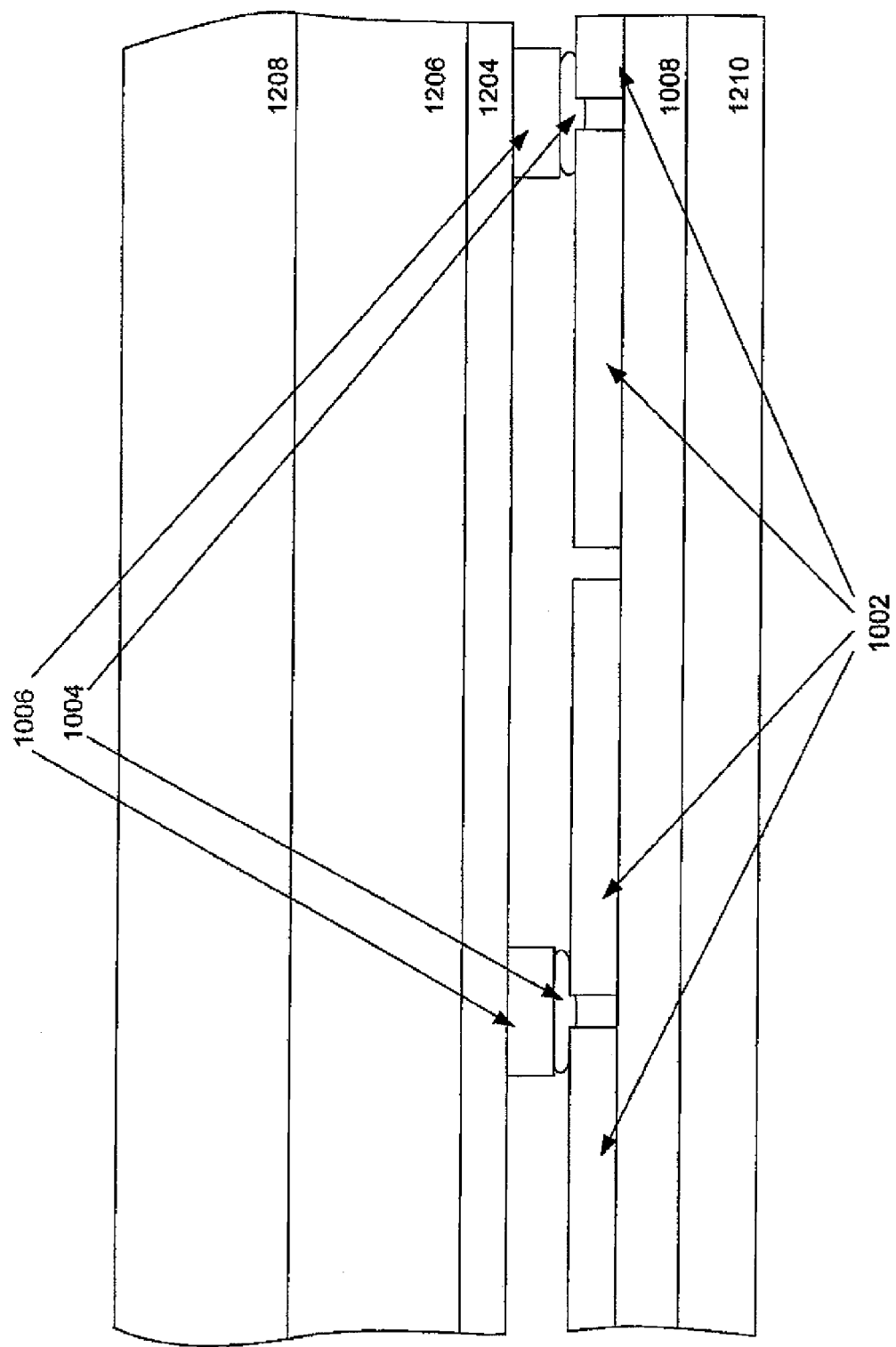
FIG. 12 is a side view of a bonding process wherein the subset of the plurality of dies of FIG. 10 is bonded to the set of straps in accordance with one preferred embodiment of the present invention.

Those of skill in the art will appreciate that, although each die is "tacked", or attached to a respective pair of straps by the adhesive 1004, as described above, the adhesive is not cured and no electrical coupling is necessarily formed between the contact pads on the dies and the straps until a curing process occurs. FIG. 12 illustrates such a curing of the bond of the subset of dies 1006 that were attached to the plurality of straps 1002 with adhesives 1004, as illustrated in FIG. 10 and FIG. 11 to form a strap assembly, in accordance with one preferred embodiment of the present invention.

As illustrated in FIG. 12 and described in more detail in, e.g., U.S. patent application Ser. No. 10/872,235, filed Jun. 18, 2004, pair of platens 1210 and 1208 forces together the plurality of straps 1002, the adhesives 1004, and the subset of dies 1006. The provision of near infrared (NIR) energy from a NIR emitter chamber 1208 causes the adhesives 1004 to set and an electrical connection to be made between the contacts on each of the dies to a respective contact on each of the straps. A resilient layer 1204 enables the pressure to be applied to the strap assembly uniformly. In one preferred embodiment of the present invention, the platen 1206 and resilient layer 1204 are made of quartz and silicon, respectively, as quartz and silicon are nearly transparent to NIR.

Figure 13:
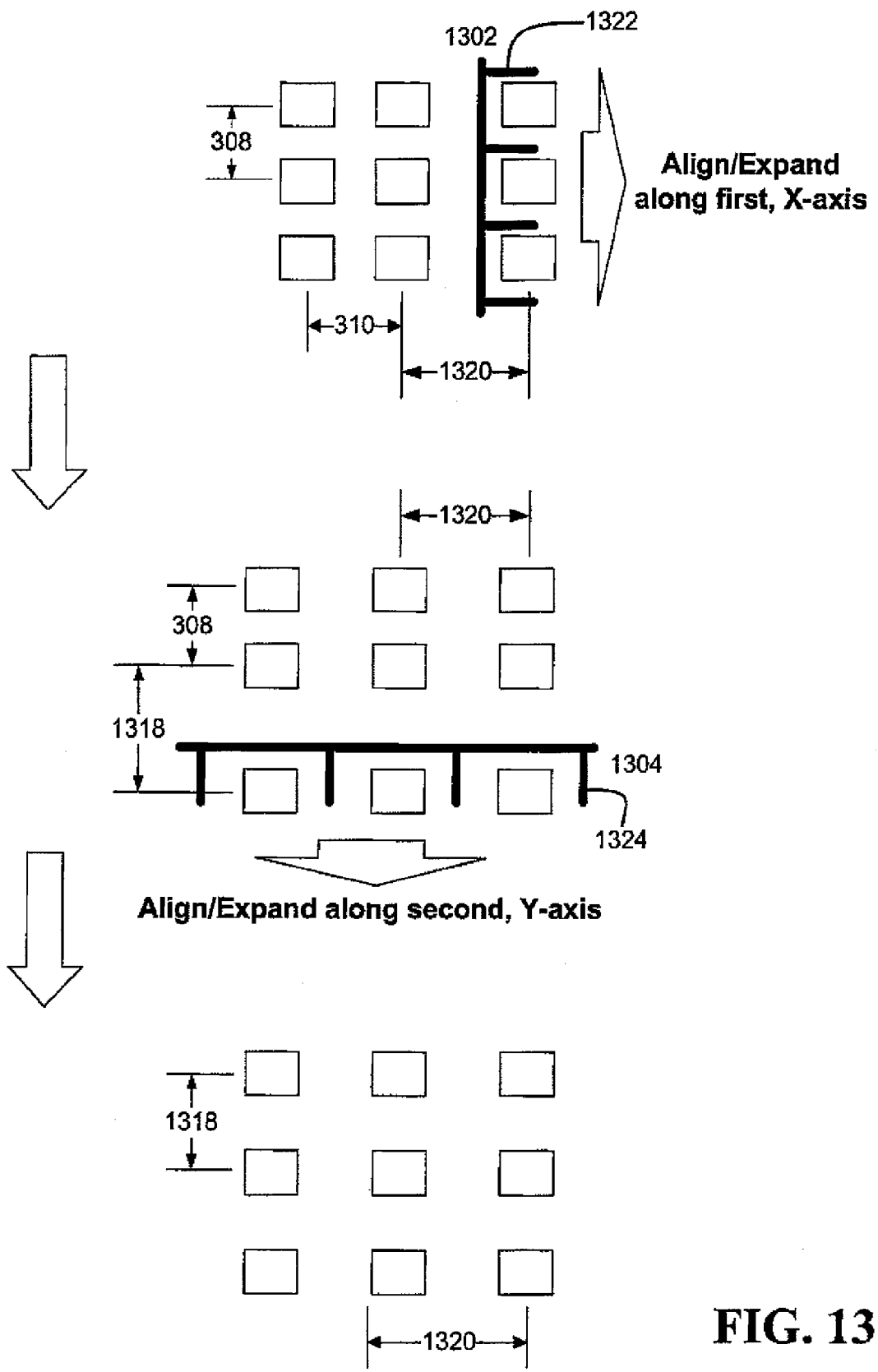
FIG. 13 is a diagram illustrating the alignment of the plurality of dies using combs configured in accordance with one preferred embodiment of the present invention.

FIG. 13 illustrates a second approach for increasing the pitch between the array of dies 316 from their original orthogonal wafer pitches 308, 310 to another pitches 1318, 1320, respectively, in accordance with another preferred embodiment of the present invention. In this approach, a comb 1302 is moved parallel to the support substrate 402 and along a first axis, herein referred to as the X-axis, to increase the pitch between two columns of dies from the small pitch 308 to the second, larger pitch 1318. In addition, a second comb 1304 is moved along a second axis, referred to herein as the Y-axis, to increase the pitch between two rows of dies from the small pitch 310 to the second pitch 1320.

In one preferred embodiment of the present invention, each of combs 1302 and 1304 includes a plurality of teeth 1322 and 1324, respectively. The spacing between each tooth in the combs may be matched to the size of the dies in the array of dies 316 to help retain the dies as they are moved. Alternatively, the spacing between each tooth in the combs may be larger to enable the comb 1302 to be used with a variety of spacings between the dies. For example, the spacing between each tooth in the comb 1324 is large enough to account for the expansion of the spacing between the dies from the movement of the comb 1302. In addition, the spacing between each pair of teeth may be large enough to accommodate more than one die. In another preferred embodiment of the present invention, a single comb such as the comb 1302 may be used to increase the pitch between dies in both axes, and the comb 1302 may either be rotated orthogonally as needed to achieve the proper orientation, or in an alternative embodiment in which the comb is not rotated, the teeth themselves may be used to move the dies. In yet another preferred embodiment of the present invention, blades that do not include teeth are used to increase the pitch between dies.

It should be obvious to those of ordinary skill in the art that although the description contained herein with regard to the change in pitches between the dies in the plurality of dies 306 has been directed to an operation to increase the pitches in one or more dimensions, the techniques may also be equally be applicable to operations to decrease the pitches between the dies in one or more dimensions. Further, because the combs 1302, 1304 may be used to change the pitch between the dies, as described above, the stretching operation as described in the expansion stage 102 is eliminated. In another preferred embodiment, the combs 1302, 1304 may be used perform an alignment of the dies and not specifically to change the spacing between the dies.

As described herein, the die detachment and separation process of the present invention provides manufacturers the ability to perform batch processing of a large number of dies simultaneously, providing volumes that surpasses those achievable by such inherently slower approaches as the one-by-one pick-and-place process. The present invention provides these benefits through such approaches as direct chip separation, where removal of the dies from a wafer tape will not cause the orientation or the sides of the dies/chips to be perturbed; and selective transfer, a process where the chips are separated, or spaced apart, at distance where a multiple thereof will match the distance in pitch of the straps. Advantages of the direct chip separation technique over other assembly methods include the ability for manufacturers to perform massive complete wafer-by-wafer or segment-by-segment transfers of dies from wafers directly to another surface such as a web without significant change in pattern or orientation of the dies. In addition, although the stretching step used to implement the spacing needed for selective transfer is likely to be a low precision operation (depending on the amount of separation needed), a separate alignment step can be used to address any inaccuracies in positioning introduced during the stretching step.

The embodiments described above are exemplary embodiments of the present invention. Those skilled in the art may now make numerous uses of, and departures from, the above-described embodiments without departing from the inventive concepts disclosed herein. Accordingly, the present invention is to be defined solely by the scope of the following claims.

What is claimed is:

1. A method for transferring a plurality of semiconductor dies from a first substrate, the method comprising:
filling an interstitial space between the plurality of dies arranged on the first substrate in an array having a first dimension with a solidifiable substance;
solidifying the substance such that a respective position of each of the dies in the array is fixed;
removing the first substrate from the plurality of dies;
removing the solidified substance from between the plurality of dies such that the plurality of dies remain arrayed at the first dimension;

providing, where each die in the array of dies includes at least one contact and each die in the array of dies is set off from another die by a first pitch as measured between the respective contacts of each die, a plurality of electrical components arranged in an array on a second substrate, the plurality of electrical components having attachment locations disposed at the first pitch;

registering the second substrate with the array of dies such that respective attachment locations of the plurality of electrical components are matched with the respective at least one contact of the dies; and, electrically coupling respective ones of the plurality of electrical components to respective, corresponding ones of the dies in the array of dies.

2. The method of claim 1, further comprising after removing the solidified substance:

providing a grid containing an array of apertures;

placing the grid over the dies such that the grid is disposed parallel to the array of dies and each of the dies is disposed in a respective one of the apertures in the array of apertures; and displacing the grid by a selected amount in at least a first direction and parallel to a support surface on which the array of dies rests.

3. The method of claim 2, further comprising displacing the grid by a second selected amount in a second direction orthogonal to the first direction.

4. The method of claim 1, further comprising:

providing a comb comprising a plurality of teeth;

placing the comb over a first line of dies in the plurality of dies such that at least one of the dies in the first line of dies is disposed in one of a plurality of slots, each slot being defined by a pair of teeth in the plurality of teeth; and, displacing the comb by a selected amount in at least a first direction and parallel to a plane defined by the array of dies.

5. The method of claim 4, further comprising displacing the comb by a second selected amount in a second direction orthogonal to the first direction.

6. The method of claim 4, further comprising:

disengaging the comb from the line of dies;

rotating the comb by a predetermined amount while maintaining the plurality of slots parallel to the plane; and, placing the comb over a second line of dies of the plurality of dies such that each of the dies in the second line of dies is disposed in a respective one of the plurality of slots, the second line of dies being perpendicular to the first line of dies.

7. The method of claim 1, wherein each die in the plurality of dies has a size, further comprising:

providing a planar material with an array of apertures, wherein each aperture comprises:

1) a first opening located on a first surface of the planar material, the first opening being larger than the size of each die in the plurality of dies, and 2) a second opening located on a second surface of the planar material, the second opening being smaller than the first opening but no larger than the size of the dies; and placing the planar material in contact with the plurality of dies such that the planar material is parallel to a plane defined by the array of dies and each of the dies is disposed in a respective one of the first openings of the array of apertures and held in place by corresponding one of the second openings.

8. A method for creating an arrangement of integrated circuits comprising:

providing a wafer with an array of dies, each containing an integrated circuit, disposed on a substrate, the array of dies having a first dimensional size;

stretching the substrate so that the array of dies reaches a second dimensional size;

fixing the array of dies at the second dimensional size with a solid material before removal of the substrate; and removing the solid material by a gasification process, wherein the array of dies remains at the second dimensional size after the removal of the solid material.

9. The method of claim 8, wherein fixing the array of dies with the solid material comprises:

introducing a solidifiable substance between the dies; and changing the solidifiable substance into a solid.

10. The method of claim 9, wherein the solidifiable substance is a liquid.

11. The method of claim 8, wherein removing the solid material by a gasification process comprises sublimating the solid material.

12. A method for making an RFID assembly comprising:

providing a wafer comprising an array of dies, the array of dies having a length and a width;

attaching a substrate to the array of dies;

stretching the substrate such that at least one of the length and width of the array of dies is increased from a first dimension to a selected second dimension and each die in the array is spaced apart from adjacent ones of the dies by a selected pitch;

fixing the array of dies at the second selected dimension and die pitch;

introducing a liquid into the separation between each die; solidifying the liquid into a solid;

removing the substrate; and converting the solid into a gas.

13. The method of claim 12, wherein the liquid comprises water, and solidifying the liquid into the solid comprises freezing the water.

14. The method of claim 13, further comprising sublimating the frozen liquid and leaving the array of dies at the second dimensional size.

15. The method of claim 12, wherein the liquid comprises a polymer, and solidifying the liquid into the solid comprises reacting the polymer.

* * * * *